(12) United States Patent
Ikemoto et al.

(10) Patent No.: US 6,638,694 B2
(45) Date of Patent: Oct. 28, 2003

(54) RESIST STRIPPING AGENT AND PROCESS OF PRODUCING SEMICONDUCTOR DEVICES USING THE SAME

(75) Inventors: Kazuto Ikemoto, Niigata-ken (JP); Hisaki Abe, Niigata-ken (JP); Taketo Maruyama, Niigata-ken (JP); Tetsuo Aoyama, Niigata-ken (JP)

(73) Assignee: Mitsubishi Gas Chemical Company, Inc, Tokyo (JP)

( * ) Notice: Subject to any disclaimer, the term of this patent is extended or adjusted under 35 U.S.C. 154(b) by 0 days.

(21) Appl. No.: 10/375,105

(22) Filed: Feb. 28, 2003

(65) Prior Publication Data
US 2003/0186175 A1 Oct. 2, 2003

Related U.S. Application Data

(62) Division of application No. 09/504,926, filed on Feb. 16, 2000, now abandoned.

(51) Int. Cl.[7] ................................................ G03F 7/42
(52) U.S. Cl. ........................ 430/331; 430/329; 510/176
(58) Field of Search ................................ 430/331, 329; 510/176

(56) References Cited

U.S. PATENT DOCUMENTS

| 3,899,370 A | 8/1975 | Takahashi et al. |
| 4,744,834 A | 5/1988 | Haq ........................... 430/329 |
| 4,770,713 A | 9/1988 | Ward ........................... 430/329 |
| 5,102,777 A | 4/1992 | Lin et al. ..................... 430/329 |
| 5,480,585 A | 1/1996 | Shiotsu et al. |
| 5,599,444 A | 2/1997 | Baron et al. ................ 210/167 |
| 5,612,304 A | 3/1997 | Honda et al. |
| 5,905,063 A | 5/1999 | Tanabe et al. ............... 510/176 |
| 5,942,570 A | 8/1999 | Matsukura et al. |

FOREIGN PATENT DOCUMENTS

| JP | 62-49355 | 3/1987 |
| JP | 62-95531 | 5/1987 |
| JP | 64-81949 | 3/1989 |
| JP | 64-81950 | 3/1989 |
| JP | 5-273768 | 10/1993 |
| JP | 6-266119 | 9/1994 |
| JP | 8-137113 | 5/1996 |
| WO | 87/05314 | 9/1987 |
| WO | 95/24257 | 9/1995 |
| WO | WO96/22339 | 7/1996 |

Primary Examiner—Richard L. Schilling
(74) Attorney, Agent, or Firm—Antonelli, Terry, Stout & Kraus, LLP

(57) ABSTRACT

A resist stripping agent comprising a specific alkanolamine having at least one functional group represented by the following formula (I):

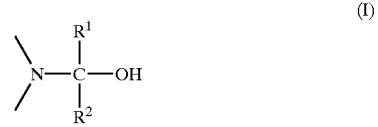

wherein $R^1$ and $R^2$ are each hydrogen atom, $C_1$–$C_8$ alkyl or $C_1$–$C_8$ alkenyl. The resist stripping agent easily and efficiently removes resist films and resist residues remaining after etching or after ashing subsequent to etching in manufacturing semiconductor devices at low temperatures in short period of time. The resist stripping agent is resistant to corrosion against materials for substrate, circuits and insulating films.

10 Claims, 1 Drawing Sheet

RESIST STRIPPING AGENT AND PROCESS OF PRODUCING SEMICONDUCTOR DEVICES USING THE SAME

This application is a Divisional Application of Application No. 09/504,926, filed Feb. 16, 2000, now abandoned, the contents of Application No. 09/504,926, filed Feb. 16, 2000, being incorporated herein by reference in their entirety.

FIELD OF THE INVENTION

The present invention relates to a resist stripping agent for use in fabricating circuits or forming electrodes on semiconductor devices for semiconductor integrated circuits or liquid crystal displays, and further to a process of producing semiconductor devices using the resist stripping agent.

BRIEF DESCRIPTION OF THE PRIOR ART

Semiconductor devices for semiconductor integrated circuits or liquid crystal displays have been generally produced by the steps of coating an inorganic substrate with a resist composition; patterning the resist film by exposure to light and subsequent development; etching exposed portions of the inorganic substrate using the patterned resist film as a mask to form minute circuits; and removing the resist film from the inorganic substrate. Alternatively, after forming minute circuits, the resist film is ashed and the remaining resist residues are removed from the inorganic substrate.

Japanese Patent Application Laid-Open Nos. 62-49355, 62-95531 and 5-273768 disclose to remove the resist film and resist residues by organic amine-containing stripping agents free of water. However, the proposed organic amine-containing stripping agents have poor removal capability to the resist film after etching and the resist residue after etching and ashing.

Fine processing recently coming to be extensively employed in manufacturing semiconductor devices requires more strictly controlled etching conditions, this in turn requiring resist films to have surfaces with higher hardness. Also, the fine processing creates resist residues having complicated chemical compositions by etching and plasma ashing. The proposed organic amine-containing stripping agents have been found to be less effective for removing such resist films and resist residues.

In case of dry etching, sidewall polymers as resist residues are formed from dry etching gas, resist materials and various inorganic materials. The known organic amine-containing stripping agents are also less effective for removing the sidewall polymers.

Japanese Patent Application Laid-Open Nos. 64-81949, 64-81950 and 6-266119 disclose alkanol amine-containing aqueous stripping agents. However, these alkanol amine-containing aqueous stripping agents are still insufficient for removing the above resist films and resist residues.

The substrates of semiconductor devices for semiconductor integrated circuits or liquid crystal displays are recently made of various inorganic materials. Therefore, a resist stripping agent resistant to corrosion of such inorganic materials have been demanded to be developed.

A general object of the present invention is to solve the above problems in the prior art stripping agents.

Another object of the present invention to provide a resist stripping agent which easily removes resist films coated on an inorganic substrate at low temperatures in a short period of time without corroding the inorganic substrates made of various inorganic materials, thereby ensuring fabrication of high precision circuits.

A yet another object of the present invention is to provide a resist stripping agent which easily removes resist films remaining after etching on an inorganic substrate at low temperatures in a short period of time without corroding the inorganic substrates made of various inorganic materials, thereby ensuring fabrication of high precision circuits.

A still another object of the present invention is to provide a resist stripping agent which easily removes resist residues remaining after ashing subsequent to etching on an inorganic substrate at low temperatures in a short period of time without corroding the inorganic substrates made of various inorganic materials, thereby ensuring fabrication of high precision circuits.

A further object of the present invention is to provide a process of producing semiconductor devices using such resist stripping agents.

SUMMARY OF THE INVENTION

As a result of extensive researches in view of the above objects, the inventors have found that a resist stripping agent comprising a specific alkanolamine (stripping alkanolamine) removes patterned resist films and resist residues remaining after etching and resist residues remaining after ashing subsequent to etching easily and quickly without corroding circuit elements, insulating films, etc., thereby ensuring fine processing to produce high precision circuits. The present invention has been accomplished based on this finding.

Thus, the present invention provides:

(A) a resist stripping agent comprising a stripping alkanolamine having in its molecule at least one functional group represented by the following formula (I):

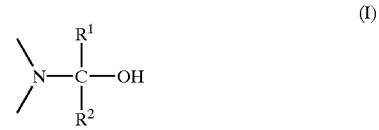

(I)

wherein $R^1$ and $R^2$ are each hydrogen atom, $C_1$–$C_8$ alkyl or $C_1$–$C_8$ alkenyl;

(B) a process of producing semiconductor devices including a step of removing resist films and/or resist residues remaining after etching resist films by the resist stripping agent; and (C) a process of producing semiconductor devices including a step of removing resist films and/or resist residues remaining after ashing etched resist film by the resist stripping agent.

DETAILED DESCRIPTION OF THE INVENTION

Figure 1:
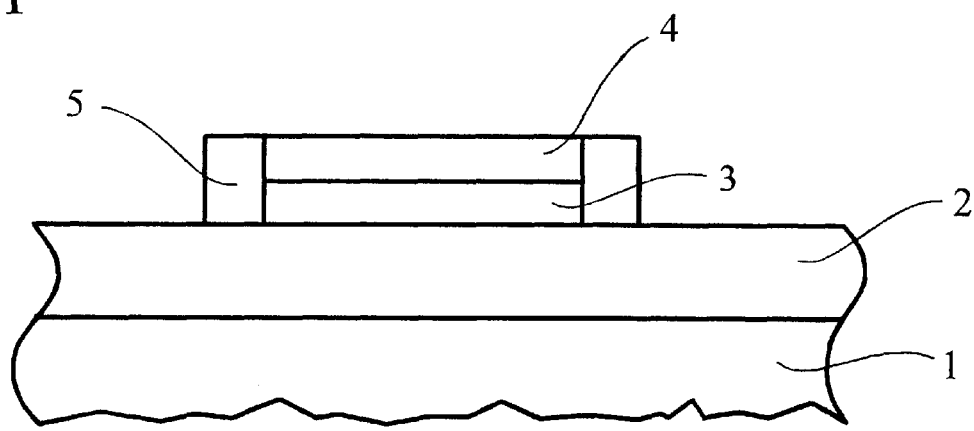
FIG. 1 is a cross sectional view showing a semiconductor device having aluminum (Al—Cu) circuit pattern formed by dry etching using a resist film as a mask.

The specific stripping alkanolamines used in the present invention have in its molecule at least one functional group represented by the following formula (I):

wherein $R_1$ and $R^2$ are each hydrogen atom, $C_1$–$C_8$ alkyl or $C_1$–$C_8$ alkenyl.

Preferred functional groups represented by the formula (I) are

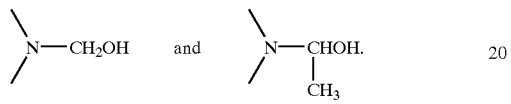

Examples of the stripping alkanolamine are:
(1) aliphatic stripping alkanolamines such as N-hydroxymethylmethylamine, N-hydroxymethyldimethylamine, N,N-dihydroxymethylmethylamine, N-(α-hydroxyethyl)methylamine, N-(α-hydroxyethyl)dimethylamine, N,N-(di-α-hydroxyethyl)methylamine, N-hydroxymethylethylamine, N-hydroxymethyldiethylamine, N,N-dihydroxymethylethylamine, N-(α-hydroxyethyl)ethylamine, N-(α-hydroxyethyl)diethylamine, N,N-(di-α-hydroxyethyl)ethylamine, N-hydroxymethylpropylamine, N-hydroxymethyldipropylamine, N,N-dihydroxymethylpropylamine, N-(α-hydroxyethyl)propylamine, N-(α-hydroxyethyl)dipropylamine, N,N-(di-α-hydroxyethyl)propylamine, N-hydroxymethylbutylamine, N-hydroxymethyldibutylamine, N,N-dihydroxymethylbutylamine, N-(α-hydroxyethyl)butylamine, N-(α-hydroxyethyl)dibutylamine, N,N-(di-α-hydroxyethyl)butylamine, N-hydroxymethylpentylamine, N-hydroxymethyldipentylamine, N,N-dihydroxymethylpentylamine, N-(α-hydroxyethyl)pentylamine, N-hydroxymethylhexylamine, N-hydroxymethyldihexylamine, N,N-dihydroxymethylhexylamine, N-(α-hydroxyethyl)hexylamine, N-hydroxymethylheptylamine, N-hydroxymethyldiheptylamine, N,N-dihydroxymethylheptylamine, N-hydroxymethyloctylamine, N-hydroxymethyldioctylamine, N,N-dihydroxymethyloctylamine, N-(α-hydroxyethyl)octylamine, N-hydroxymethylmethylethylamine, N-(α-hydroxyethyl)methylethylamine, N-hydroxymethylmethlpropylamine, N-(α-hydroxyethyl)methylpropylamine, N-hydroxymethylmethylbutylamine, N-(α-hydroxyethyl)methylbutylamine, N-hydroxymethylethylpropylamine, N-(α-hydroxyethyl)ethylpropylamine, N-hydroxymethylethylbutylamine, N-(α-hydroxyethyl)ethylbutylamine, N-hydroxymethylethanolamine (CAS No. 65184-12-5), N-(α-hydroxyethyl)ethanolamine, N,N-dihydroxymethylethanolamine, N,N-(di-α-hydroxyethyl)ethanolamine, N-hydroxymethyldiethanolamine, N-(α-hydroxyethyl)diethanolamine, N-hydroxymethyl-N-methlyethanolamine, N-(α-hydroxyethyl)-N-methyleth anolamine, N-hydroxymethyl-N-propylethanolamine, N-(α-hydroxyethyl)-N-propylethanolamine, N-hydroxymethyl-N-butylethanolamine, N-(α-hydroxyethyl)-N-butylethanolamine, N-hydroxymethylisopropanolamine (CAS No. 76733-35-2), N-(α-hydioxyethyl)isopropanolamine, N,N-dihydroxymethylisoprop anolamine, N,N-(di-α-hydroxyethyl)isopropanolamine, N-hydroxymethyldiisopropanolamine, N-(α-hydroxyethyl)diisopropanolamine, N-hydroxymethyl-N-methylisopropanolamine, N-(α-hydroxyethyl)-N-methylisoprop anolamine, N-hydroxymethyl-N-ethylisoprop anolamine, N-(α-hydroxyethyl)-N-ethylisopropanolamine, N-hydroxymethyl-N-propylisopropanolamine, N-(α-hydroxyethyl)-N-propylisopropanolamine, N-hydroxymethyl-N-butylisopropanolamine, N-(α-hydroxyethyl)-N-butylisopropanolamine, N-hydroxymethylaminoethoxyethanol, N-(α-hydroxyethyl)aminoethoxyethanol, N,N-dihydroxymethylaminoethoxyethanol, N,N-(di-α-hydroxyethyl)aminoethoxyethanol, N-hydroxymethylamino-2-methylpropanol, N-(α-hydroxyethyl)amino-2-methylpropanol, N,N-dihydroxymethylamino-2-methylpropanol, and N,N-(di-α-hydroxyethyl)amino-2-methylpropanol;

aliphatic alkanol polyamines such as N-hydroxymethylethylenediamine (CAS No. 41434-24-6), N-(α-hydroxyethyl)ethylenediamine, N,N-dihydroxymethylethylenediamine (CAS No. 70495-38-4), N-hydroxymethylbutylenediamine (CAS No. 66210-83-1), N-hydroxymethylpropylenediamine (CAS No. 66210-82-0), N,N'-dihydroxymethylbutylenediamine, N,N-dihydroxymethylbutylenediamine, N,N,N'-trihydroxymethylbutylenediamine, N,N,N',N'-tetrahydroxymethylbutylenediamine, N,N'-dihydroxymethylpropylenediamine, N,N-dihydroxymethylpropylenediamine, N,N,N'-trihydroxymethylpropylenediamine, N,N,N',N'-tetrahydroxymethylpropylenediamine, N,N-(di-α-hydroxyethyl)ethylenediamine, N,N,N'-trihdroxymethylethylenediamine, N,N,N'-(tri-α-hydroxyethyl)ethylenediamine, N,N,N',N'-tetrahydroxymethylethylenediamine, N,N,N',N'-(tetra-α-hydroxyethyl)ethylenediamine, N-hydroxymethyl-N-methylethylenediamine, N-(α-hydroxyethyl)-N-methylethylenediamine, N,N'-dihydroxymethyl-N-methylethylenediamine, N,N'-(di-α-hydroxyethyl)-N-methylethylenediamine, N,N',N'-(tri-α-hydroxyethyl)-N-methylethylenediamine, N,N',N'-trihydroxymethyl-N-methylethylenediamine, N-hydroxymethyl-N',N'-dimethylethylenediamine, N-(α-hydroxyethyl)-N',N'-dimethylethylenediamine, N,N-dihydroxymethyl-N',N'-dimethylethylenediamine, N,N-(di-α-hydroxyethyl)-N',N'-dimethylethylenediamine, N-hydroxymethyl-N,N',N'-trimethylethylenediamine, N-(α-hydroxyethyl)-

N,N',N'-trimethylethylenediamine, N-hydroxymethyl-N-ethylethylenediamine, N,N'-dihydroxymethyl-N-ethylethylenediamine, N,N',N'-trihydroxymethyl-N-methylethylenediamine, N-hydroxymethyl-N',N'-diethylethylenediamine, N,N-dihydroxymethyl-N',N'-diethylethylenediamine, N-hydroxymethyl-N,N',N'-triethylethylenediamine, N-hydroxymethylpropylenediamine, N,N-dihydroxymethylpropylenediamine, N,N,N'-trihydroxymethylpropylenediamine, N,N,N',N'-tetrahydroxymethylpropylenediamine, N-hydroxymethylbutylenediamine, N,N-dihydroxymethylbutylenediamine, N,N,N'-trihydroxymethylbutylenediamine, N,N,N',N'-tetrahydroxymethylbutylenediamine, N-hydroxymethyldiethylenetriamine, N,N"-dihydroxymethyldiethylenetriamine, and N-hydroxymethyltriethylenetetramine;

(2) aliphatic alkanol unsaturated amines such as N-hydroxymethylallylamine, N,N-dihydroxymethylallylamine, N-(α-hydroxyethyl)allylamine, N,N-(di-α-hydroxyethyl)allylamine, N-hydroxymethyldiallylamine, N-hydroxymethyl-N-methylallylamine, and N-hydroxymethyl-N-ethylallylamine;

(3) cyclic stripping alkanolamines such as N-hydroxymethylpyrrole, N-(α-hydroxyethyl)pyrrole, N-hydroxymethyl-methylpyrrole, N-hydroxymethyl-dimethylpyrrole, N-hydroxymethyl-trimethylpyrrole, N-hydroxymethylpyrrolidine, N-(α-hydroxyethyl)pyrrolidine, N-hydroxymethyl-methylpyrrolidine, N-hydroxymethylpyrazole, N-hydroxymethylimidazole, N-hydroxymethyltriazole, N-hydroxymethyltetrazole, N-hydroxymethylpiperidine, N-(α-hydroxyethyl)piperidine, N-hydroxymethylpipecoline, N-hydroxymethyllupetidine, N-hydroxymethylpiperazine, N,N-dihydroxymethylpiperazine, N-(α-hydroxyethyl)piperazine, N-hydroxymethylmethylpiperazine, N-hydroxymethylmorpholine, and N-(α-hydroxyethyl)morpholine; and (4) apliphatic alkanol ether amines such as N-hydroxymethylmethoxyethylamine, N-(α-hydroxyethyl)methoxyethylamine, N,N-dihydroxymethylmethoxyethylamine, N-hydroxymethylmethoxypropylamine, N,N-dihydroxymethylmethoxypropylamine, N-hydroxymethylethoxyethylamine, N-(α-hydroxyethyl)ethoxyethylamine, N,N-dihydroxymethylethoxyethylamine, N-hydroxymethylethoxypropylamine, and N,N-dihydroxymethylethoxypropylamine.

Of the stripping alkanolamines, preferred are compounds represented by the following formula (II):

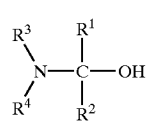

(II)

wherein $R_1$ and $R_2$ are as defined above, $R^3$ is $C_1$–$C_{10}$ alkyl, $C_1$–$C_{10}$ alkenyl, amino, $C_1$–$C_{10}$ hydroxyalkyl, $C_1$–$C_{10}$ aminoalkyl, ($C_1$–$C_{10}$ alkyl)phenyl, phenyl ($C_1$–$C_{10}$)alkyl, $C_1$–$C_{10}$ alkoxy, ($C_1$–$C_{10}$)alkoxy ($C_1$–$C_{10}$)alkyl, hydroxy($C_1$–$C_{10}$)alkyloxy($C_1$–$C_{10}$)alkyl, $C_1$–$C_{10}$ alkylamino, amino($C_1$–$C_{10}$)alkyloxy($C_1$–$C_{10}$)alkyl, hydroxy($C_1$–$C_{10}$)alkylamino($C_1$–$C_{10}$)alkyl; $R^4$ is hydrogen, —$CH_2OH$, —$CH(OH)CH_3$, $C_1$–$C_{10}$ alkyl, $C_1$–$C_{10}$ alkenyl, amino, $C_1$–$C_{10}$ hydroxyalkyl, $C_1$–$C_{10}$ aminoalkyl, ($C_1$–$C_{10}$ alkyl)phenyl, phenyl($C_1$–$C_{10}$)alkyl, $C_1$–$C_{10}$ alkoxy, ($C_1$–$C_{10}$)alkoxy($C_1$–$C_{10}$)alkyl, hydroxy($C_1$–$C_{10}$)alkyloxy ($C_1$–$C_{10}$)alkyl, $C_1$–$C_{10}$ alkylamino, amino($C_1$–$C_{10}$)alkyloxy($C_1$–$C_{10}$)alkyl, hydroxy($C_1$–$C_{10}$)alkylamino ($C_1$–$C_{10}$)alkyl; or $R^3$ and $R^4$ together with the nitrogen to which $R^3$ and $R^4$ are bonded may form cyclic amino having 1 to 12 carbon atoms.

More preferred stripping alkanolamines are represented by the following formula (III):

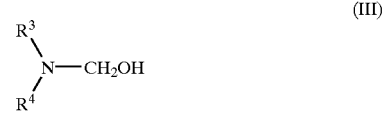

(III)

wherein $R^3$ and $R^4$ are as defined above.

Examples of more preferred stripping alkanolamines are N-hydroxymethylethanolamine, N-hydroxymethylisopropanolamine, N,N-dihydroxymethylethanolamine, N-hydroxymethyldiethanolamine, N-hydroxymethyl-N-methylethanolamine, N-hydroxymethyl-N-ethylethanolamine, N-hydroxymethylaminoethoxyethanol, N,N'-dihydroxymethylethylenediamine, N-hydroxymethylethylenediamine, N,N-dihydroxymethylethylenediamine, N,N,N'-trihydroxymethylethylenediamine, N,N,N',N'-tetrahydroxymethylethylenediamine, N-hydroxymethylbutylene,diamine, N-hydroxymethylpropylenediamine, N,N'-dihydroxymethylbutylenediamine, N,N-dihydroxymethylbutylenediamine, N,N,N'-trihydroxymethylbutylenediamine, N,N,N',N'-tetrahydroxymethylbutylenediamine, N,N'-dihydroxymethylpropylenediamine, N,N-dihydroxymethylpropylenediamine, N,N,N'-trihydroxymethylpropylenediamine, N,N,N',N'-tetrahydroxymethylpropylenediamine, N-hydroxymethyldiethylenetriamine, N,N"-dihydroxymethyldiethylenetriamine, N-hydroxymethylmethylamine, N,N-dihydroxymethylmethylamine, N-hydroxymethyldimethylamine, N-hydroxymethylethylamine, N-hydroxymethyldiethylamine, N,N-dihydroxymethylethylamine, N-hydroxymethylpropylamine, N-hydroxymethylbutylamine, N-hydroxymethylpiperazine, and N-hydroxymethylmorpholine. In some cases, stripping alkanolamines represented by the formula (III) wherein $R^4$ is hydrogen are preferred in view of their high removal capability.

The above stripping alkanolamines are used alone or in combination of two or more. When the stripping alkanolamine is liquid, it may be directly used as the resist stripping agent without diluting with a solvent. If desired, the resist stripping agent may be made into a composition comprising the stripping alkanolamine and at least one of an additive amine, an organic solvent, an anti-corrosion agent, water and a quaternary ammonium hydroxide to form a stripping composition.

The additive amines usable in the present invention may be alkylamines, alkanolamines, polyamines, hydroxylamines and cyclic amines.

The alkylamines may be aliphatic primary alkylamines such as methylamine, ethylamine, n-propylamine, isopropylamine, n-butylamine, sec-butylamine, isobutylamine, t-butylamine, pentylamine, 2-aminopentane, 3-aminopentane, 1-amino-2-methylbutane, 2-amino-2-methylbutane, 3-amino-2-methylbutane, 4-amino-2-methylbutane, hexylamine, 5-amino-2-methylpentane, heptylamine, octylamine, nonylamine, decylamine, undecylamine, dodecylamine, tridecylamine, tetradecylamine, pentadecylamine, hexadecylamine, heptadecylamine, and octadecylamine;

aliphatic secondary alkylamines such as dimethylamine, diethylamine, dipropylamine, diisopropylamine, dibutylamine, diisobutylamine, di-sec-butylamine, di-t-butylamine, dipentylamine, dihexylamine, diheptylamine, dioctylamine, dinonylamine, didecylamine, methylethylamine, methypropylamine, methylisopropylamine, methylbutylamine, methylisobutylamine, methyl-sec-butylamine, methyl-t-butylamine, methylamylamine, methylisoamylamine, ethylpropylamine, ethylisopropylamine, ethylbutylamine, ethylisobutylamine, ethyl-sec-butylamine, ethyl-t-butylamine, ethylisoamylamine, propylbutylamine, and propylisobutylamine; and aliphatic tertiary alkylamines such as trimethylamine, triethylamine, tripropylamine, tributylamine, tripentylamine, dimethylethylamine, dimethylpropylamine, methyldiethylamine, and methyldipropylamine.

The alkanolamines usable as the additive amines may be aliphatic alkanolamines such as ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, and 2-(2-aminoethoxy)ethanol.

The polyamines may be ethylenediamine, propylenediamine, butylenediamine, trimethylenediamine, tetramethylenediamine, 1,3-diaminobutane, 2,3-diaminobutane, pentamethylenediamine, 2,4-diaminopentane, hexamethylenediamine, heptamethylenediamine, octamethylenediamine, nonamethylenediamine, N-methylethylenediamine, N,N-dimethylethylenediamine, trimethylethylenediamine, N-ethylethylenediamine, N,N-diethylethylenediamine, triethylethylenediamine, 1,2,3-triaminopropane, tris(2-aminoethyl)amine, tetra(aminomethyl)methane, diethylenetriamine, triethylenetetramine, tetraethylenepentamine, heptaethyleneoctamine, and nonaethylenedecamine.

The hydroxylamines may be hydroxylamine, N-methylhydroxylamine, N-ethylhydroxylamine, and N,N-diethylhydroxylamine.

The cyclic amines may be pyrrole, 2-methylpyrrole, 3-methylpyrrole, 2-ethylpyrrole, 3-ethylpyrrole, 2,3-dimethylpyrrole, 2,4-dimethylpyrrole, 3,4-dimethylpyrrole, 2,3,4-trimethylpyrrole, 2,3,5-trimethylpyrrole, 2-pyrroline, 3-pyrroline, pyrrolidine, 2-methylpyrrolidine, 3-methylpyrrolidine, pyrazole, imidazole, 1,2,3-trizaole, 1,2,3,4-tetrazole, pipeiidine, 2-pipecoline, 3-pipecoline, 4-pipecoline, 2,4-lupetidine, 2,6-lupetidine, 3,5-lupetidine, piperazine, 2-methylpiperazine, 2,5-dimethylpiperazine, 2,6-dimethylpiperazine, and morpholine.

Of the above additive amines, particularly preferred are methylamine, ethylamine, propylamine, butylamine, ethanolamine, N-methylethanolamine, N-ethylethanolamine, diethanolamine, isopropanolamine, 2-(2-aminoethoxy)ethanol, ethylenediamine, propylenediamine, butylenediamine, diethylenetriamine, hydroxylamine, N,N-diethylhydroxylamine, piperazine and morpholine.

The molar ratio of the stripping alkanolamine and the additive amines in total is not strictly limited, and preferably 0.01 to 100, and more preferably 0.1 to 10.

The organic solvents may be ether solvents such as ethylene glycol, ethylene glycol monoethyl ether, diethylene glycol monobutyl ether, ethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether and dipropylene glycol dimethyl ether; amide solvents such as formamide, monomethylformamide, dimethylformamide, monoethylformamide, diethylformamide, acetamide, monomethylacetamide, dimethylacetamide, monoethylacetamide, diethylacetamide, N-metylpyrrolidone and N-ethylpyrrolidone; alcohol solvents such as methyl alcohol, ethyl alcohol, isopropanol, ethylene glycol and propylene glycol;

sulfoxide solvents such as dimethyl sulfoxide; sulfone solvents such as dimethyl sulfone, diethyl sulfone, bis(2-hydroxyethyl) sulfone and tetramethylene sulfone; imidazolidinone solvents such as 1,3-dimethyl-2-imidazolidinone, 1,3-diethyl-2-imidazolidinone and 1,3-diisopropyl-2-imidazolidinone; and lactone solvents such as γ-butylolactone and δ-valerolactone.

Of the above solvents, preferred are dimethyl sulfoxide, N,N-dimethylformamide, N,N-dimethylacetamide, N-methylpyrrolidone, diethylene glycol monomethyl ether, diethylene glycol monobutyl ether, dipropylene glycol monomethyl ether and dipropylene glycol monobutyl ether.

The organic solvent is not an essential ingredient of the resist stripping agent, and may be added in an amount of 5 to 80% by weight based on the resist stripping agent, if used.

The anti-corrosion agents may be selected from sugars, sugar alcohols, aromatic hydroxy compounds, acetylene alcohols, carboxylic compounds and anhydrides thereof, and triazole compounds. The use of the anti-corrosion agents is not critical in the present invention, and the amount thereof, if used, is preferably 1 to 35% by weight based on the resist stripping agent.

The sugars may be monosaccharide having 3 to 6 carbon atoms such as glycerin aldehyde, threose, arabinose, xylose, ribose, ribulose, xylulose, glucose, mannose, galactose, tagatose, allose, altrose, gulose, idose, talose, sorbose, psicose and fructose, and disaccharide such as trehalose.

The sugar alcohols may be threitol, erythritol, adonitol, arabitol, xylitol, talitol, sorbitol, mannitol, iditol, dulcitol and inositol.

The aromatic hydroxy compounds may be phenol, cresol, xylenol, pyrocatechol, resorcinol, hydroquinone, pyrogallol, 1,2,4-benzenetriol, salicyl alcohol, p-hydroxybenzyl alcohol, p-hydroxyphenetyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid and gallic acid.

The acetylene alcohols may be 2-butyne-1,4-diol, 3,5-dimethyl-1-hexyne-3-ol, 2-methyl-3-butyne-2-ol, 3-methyl-1-pentyne-3-ol, 3,6-dimethyl-4-octyne-3,6-diol, 2,4,7,9-tetramethyl-5-decyne-4,7-diol and 2,5-dimethyl-3-hexyne-2,5-diol.

The carboxylic compounds and anhydrides thereof may be formic acid, acetic acid, propionic acid, butyric acid, isobutyric acid, oxalic acid, malonic acid, succinic acid, gultaric acid, maleic acid, fumaric acid, benzoic acid, phthalic acid, 1,2,3-benzenetricarboxylic acid, glycolic acid, diglycolic acid, lactic acid, malic acid, citric acid, acetic anhydride, phthalic anhydride, maleic anhydride, succinic anhydride and salicylic acid.

The triazole compounds may be benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

Of the above anti-corrosion agents, preferred are sorbitol, xylitol, pyrocatechol, gallic acid, 2-butyne-1,4-diol, phthalic acid, phthalic anhydride, salicylic acid and benzotriazole. The anti-corrosion agents may be used alone or in combination of two or more.

The resist stripping agent the present invention may contain or not contain water. Although the concentration of water in the resist stripping agent, if used, is determined considering etching conditions, ashing conditions, etc., it is preferably 5 to 60% by weight based on the resist stripping agent.

A quaternary ammonium hydroxide such as tetramethylammonium hydroxide (TMAH) may be preferably added to further enhance the removal of resist, particularly resist residues remaining after etching or ashing. The amount of TMAH, if used, is preferably 0.03 to 5% by weight based on the resist stripping agent.

The resist stripping agent, if made into composition, is prepared by physically mixing the stripping alkanolamine with at least one additive mentioned above in an appropriate mixing apparatus in a manner known in the art.

The removal of resist in manufacturing semiconductor devices is usually performed by contacting the substrates having resist films and resist residues with the resist stripping agent of the present invention at room temperature to 150° C. Since the resist stripping agent shows a sufficient removal capability at 60° C. or lower, the removal is preferably conducted at a temperature as low as possible to protect semiconductor materials from the attack by the stripping agent. The contacting time depends on the nature and thickness of resist film and resist residues as well as other factors familiar to those skilled in the art, and usually 0.5 to 30 minutes.

The materials of the inorganic substrate for the semiconductor devices to be produced by the present invention may be conducting and semiconducting materials such as silicon, amorphous silicon, polysilicon, silicon oxide, silicon nitride, aluminum, aluminum alloys, copper, copper alloys, titanium, titanium-tungsten alloys, titanium nitride, tungsten, tantalum, tantalum compounds, tantalum alloys, chromium, chromium oxide, chromium alloys, indium-tin-oxide (ITO); compound semiconductors such as gallium-arsenic, gallium-phosphorus and indium-phosphorus; and glass for LCD substrate.

In the process of producing semiconductor devices of the present invention, non-masked portions of underlying substance or material are etched using a patterned resist film as a mask, and resist residues formed during the etching are removed by the resist stripping agent mentioned above. The resist residues may be removed by the resist stripping agent after ashing subsequent to the etching.

"Ashing" referred to herein is a resist removal method in which a resist made of organic polymer is vaporized to CO and $CO_2$ by combustion in oxygen plasma. More specifically, a substrate to be treated is placed in a chamber between a pair of electrodes and then ashing gas is introduced and sealed in the chamber. Upon applying a high frequency voltage on the electrodes, the plasma of ashing gas is generated. The resist is vaporized by the reaction of activated ions in the plasma and substances on the substrate surface.

After the removal treatment using the resist stripping agent of the present invention, the treated substrate may be rinsed with any of organic solvent such as alcohol and water.

The present invention will be described in more detail by reference to the following examples. However, it should be noted that the following examples are illustrative and not intended to limit the invention thereto.

EXAMPLES 1–16 AND COMPARATIVE
EXAMPLES 1–9

FIG. 1 is a cross sectional view showing a semiconductor device being processed, in which a substrate 1 is coated with an oxide film 2, and aluminum (Al—Cu) circuit pattern 3 is formed on the oxide film 2 by dry-etching aluminum (Al—Cu) film using a resist film 4 as a mask. During the dry etching, resist reside 5 is formed.

Semiconductor devices as shown in FIG. 1 were immersed in resist stripping agents having chemical compositions shown in Tables 1 and 2 for predetermined period of time, rinsed with isopropanol, dried and observed under scanning electron microscope (SEM) to evaluate the removal of the resist film 4 and resist residue 5, and the corrosion on the aluminum (Al—Cu) circuit pattern 3. The results are shown in Tables 1 and 2.

The evaluation by SEM was expressed by the following ratings.

Removal
A: Completely removed (about 100% removal)
B: Almost completely removed (95% removal or more)
C: Partially remained (80 to 95% removal)
D: Most remained (80% removal or less)
Corrosion
A: No corrosion (less than 1% corroded area)
B: Practically no corrosion (1 to 3% corroded area)
C: Partial corrosion (3 to 5% corroded area)
D: Severe corrosion (more than 5% corroded area) and partial loss of Al—Cu film
*: Evaluation was impossible because most of the resist remained.

TABLE 1-1

|  | Examples | | | | | |
| --- | --- | --- | --- | --- | --- | --- |
|  | 1 | 2 | 3 | 4 | 5 | 6 |
| Stripping Agent | | | | | | |
| Stripping alkanolamine | | | | | | |
| kind | a1 | a1 | a1 | a1 | a1 | a1 |
| wt. % | 100 | 70 | 40 | 40 | 40 | 40 |
| Additive amine | | | | | | |
| kind | — | — | b1 | b1 | b1 | b1 |
| wt. % | — | — | 40 | 40 | 40 | 40 |
| Organic solvent | | | | | | |
| kind | — | s1 | s1 | s2 | s3 | s4 |
| wt. % | — | 30 | 20 | 20 | 20 | 20 |
| Anti-corrosion agent | | | | | | |
| kind | — | — | — | — | — | — |
| wt. % | — | — | — | — | — | — |
| $H_2O$ | | | | | | |
| wt. % | — | — | — | — | — | — |
| Stripping Conditions | | | | | | |
| temp. (° C.) | 70 | 65 | 55 | 55 | 55 | 55 |
| time (min.) | 10 | 10 | 5 | 5 | 5 | 5 |
| Removal | | | | | | |
| resist 4 | A | A | A | A | A | A |
| resist residue 5 | A | A | A | A | A | A |
| Corrosion | | | | | | |
| Al-Cu circuit 3 | A | A | A | A | A | A | a1 N-hydroxymethylethanolamine.
b1 Ethanolamine.
s1 Dimethyl sulfoxide.
s2 Dimethylformamide.
s3 Dimethylacetamide.
s4 Diethylene glycol monobutyl ether.

TABLE 1-2

|  | Examples | | | | |
| --- | --- | --- | --- | --- | --- |
|  | 7 | 8 | 9 | 10 | 11 |
| Stripping Agent | | | | | |
| Stripping alkanolamine | | | | | |
| kind | a1 | a1 | a1 | a2 | a2 |
| wt. % | 30 | 15 | 30 | 35 | 35 |
| Additive amine | | | | | |
| kind | b1 | b1 | b1 | b1 | b1 |
| wt. % | 50 | 65 | 30 | 25 | 25 |
| Organic solvent | | | | | |
| kind | — | — | s4 | s3 | s3 |
| wt. % | — | — | 15 | 15 | 15 |
| Anti-corrosion agent | | | | | |
| kind | c1 | c1 | c1 | c1 | c2 |
| wt. % | 5 | 5 | 5 | 5 | 3 |
| $H_2O$ | | | | | |
| wt. % | 15 | 15 | 20 | 20 | 22 |
| Stripping Conditions | | | | | |
| temp. (° C.) | 55 | 55 | 55 | 55 | 55 |
| time (min.) | 3 | 3 | 3 | 3 | 3 |

TABLE 1-2-continued

|  | Examples | | | | |
| --- | --- | --- | --- | --- | --- |
|  | 7 | 8 | 9 | 10 | 11 |
| Removal | | | | | |
| resist 4 | A | A | A | A | A |
| resist residue 5 | A | A | A | A | A |
| Corrosion | | | | | |
| Al-Cu circuit 3 | A | A | A | A | A | a1 N-hydroxymethylethanolamine.
a2 N-hydroxymethyl-N-methylethanolamine.
b1 Ethanolamine.
s3 Dimethylacetamide.
s4 Diethylene glycol monobutyl ether.
c1 Sorbitol.
c2 Catechol.

TABLE 1-3

|  | Examples | | | | |
| --- | --- | --- | --- | --- | --- |
|  | 12 | 13 | 14 | 15 | 16 |
| Stripping Agent | | | | | |
| Stripping alkanolamine | | | | | |
| kind | a3 | a1 | a4 | a5 | a1 |
| wt. % | 15 | 35 | 5 | 15 | 15 |
| Additive amine | | | | | |
| kind | b1 | b2 | b1 | b1 | b1 |
| wt. % | 65 | 25 | 70 | 65 | 65 |
| Organic solvent | | | | | |
| kind | — | s3 | — | — | — |
| wt. % | — | 15 | — | — | — |
| Anti-corrosion agent | | | | | |
| kind | c1 | c1 | c1 | c2 | c3 |
| wt. % | 5 | 5 | 3 | 5 | 5 |
| $H_2O$ | | | | | |
| wt. % | 15 | 20 | 22 | 15 | 15 |
| Stripping Conditions | | | | | |
| temp. (° C.) | 55 | 55 | 55 | 55 | 55 |
| time (min.) | 3 | 3 | 3 | 3 | 3 |
| Removal | | | | | |
| resist 4 | A | A | A | A | A |
| resist residue 5 | A | A | A | A | A |
| Corrosion | | | | | |
| Al-Cu circuit 3 | A | A | A | A | A | a1 N-hydroxymethylethanolamine.
a3 N-hydroxymethylamine.
a4 N,N-dihydroxymethylethanolamine.
a5 N-hydroxymethylmorpholine.
b1 Ethanolamine.
b2 N-methylethanolamine.
s3 Dimethylacetamide.
c1 Sorbitol.
c2 Catechol.
c3 Xylitol.

TABLE 2

|  | Comparative Examples | | | | | | | | |
|---|---|---|---|---|---|---|---|---|---|
|  | 1 | 2 | 3 | 4 | 5 | 6 | 7 | 8 | 9 |
| Stripping Agent | | | | | | | | | |
| Stripping alkanolamine | | | | | | | | | |
| kind | — | — | — | — | — | — | — | — | — |
| wt. % | — | — | — | — | — | — | — | — | — |
| Additive amine | | | | | | | | | |
| kind | b1 | b1 | b1 | b1 | b1 | b1 | b2 | b1 | b1 |
| wt. % | 100 | 70 | 80 | 70 | 60 | 60 | 60 | 75 | 60 |
| Organic solvent | | | | | | | | | |
| kind | — | s1 | s1 | s3 | s4 | s3 | s3 | — | s3 |
| wt. % | — | 30 | 20 | 30 | 15 | 15 | 15 | — | 15 |
| Anti-corrosion agent | | | | | | | | | |
| kind | — | — | — | — | c1 | c2 | c1 | c1 | c2 |
| wt. % | — | — | — | — | 5 | 3 | 5 | 3 | 3 |
| $H_2O$ wt. % | — | — | — | — | 20 | 22 | 20 | 22 | 22 |
| Stripping Conditions | | | | | | | | | |
| temp. (° C.) | 70 | 65 | 55 | 55 | 55 | 55 | 55 | 55 | 80 |
| time (min.) | 10 | 10 | 10 | 10 | 3 | 3 | 3 | 3 | 10 |
| Removal | | | | | | | | | |
| resist 4 | D | C | C | C | B | B | C | B | B |
| resist residue 5 | D | D | D | D | C | C | D | D | C |
| Corrosion | | | | | | | | | |
| Al—Cu circuit 3 | * | A | A | A | A | A | A | A | C | b1 Ethanolamine.
b2 N-methylethanolamine.
s1 Dimethyl sulfoxide.
s3 Dimethylacetamide.
s4 Diethylene glycol monobutyl ether.
c1 Sorbitol.
c2 Catechol.

EXAMPLES 17–31 AND COMPARATIVE EXAMPLES 10–17

Figure 2:
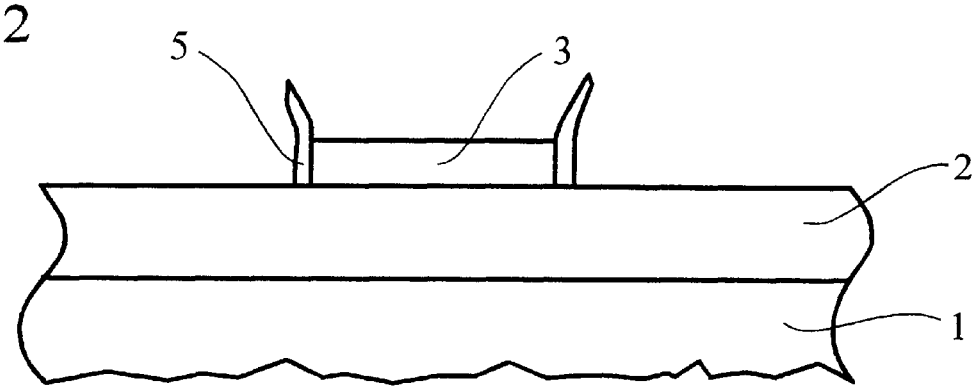
FIG. 2 is a cross sectional view showing a semiconductor device after subjecting the semiconductor device of FIG. 1 to ashing with oxygen plasma to remove the resist film.

FIG. 2 is a cross sectional view showing a semiconductor device being processed after subjecting the semiconductor device of FIG. 1 to ashing by oxygen plasma to remove the resist film 4. The resist residue 5 remains not removed by oxygen plasma and is only deformed at its upper portions so as to spread gradually outward with respect to the periphery of aluminum circuit pattern 3.

Semiconductor devices after ashing as shown in FIG. 2 were immersed in resist stripping agents having chemical compositions shown in Tables 3 and 4 for predetermined period of time, rinsed with isopropanol, dried and observed under scanning electron microscope (SEM) to evaluate the removal of the resist residue 5, and the corrosion on the aluminum (Al—Cu) circuit pattern 3 based on the same ratings as above. The results are shown in Tables 3 and 4.

After rinsing with ultra-pure water and drying, corrosion on the circuit pattern 3 was evaluated under scanning electron microscope (SEM). The results are shown in Tables 3 and 4.

TABLE 3-1

|  | Examples | | | | | |
|---|---|---|---|---|---|---|
|  | 17 | 18 | 19 | 20 | 21 | 22 |
| Stripping Agent | | | | | | |
| Stripping alkanolamine | | | | | | |
| kind | a1 | a1 | a1 | a1 | a1 | a1 |
| wt. % | 100 | 70 | 40 | 40 | 40 | 40 |
| Additive amine | | | | | | |
| kind | — | — | b1 | b1 | b1 | b1 |
| wt. % | — | — | 40 | 40 | 40 | 40 |
| Organic solvent | | | | | | |
| kind | — | s1 | s1 | s2 | s3 | s4 |
| wt. % | — | 30 | 20 | 20 | 20 | 20 |
| Anti-corrosion agent | | | | | | |
| kind | | | | | | |
| wt. % | | | | | | |
| $H_2O$ wt. % | | | | | | |
| Stripping Conditions | | | | | | |
| temp. (° C.) | 100 | 80 | 55 | 55 | 55 | 55 |
| time (min.) | 10 | 8 | 5 | 5 | 5 | 5 |
| Removal | | | | | | |
| resist residue 5 | A | A | A | A | A | A |
| Corrosion | | | | | | |
| Al-Cu circuit 3 | A | A | A | A | A | A | a1 N-hydroxymethylethanolamine.
b1 Ethanolamine.
s1 Dimethyl sulfoxide.
s2 Dimethylformamide.
s3 Dimethylacetamide.
s4 Diethylene glycol monobutyl ether.

TABLE 3-2

|  | Examples | | | | |
|---|---|---|---|---|---|
|  | 23 | 24 | 25 | 26 | 27 |
| Stripping Agent | | | | | |
| Stripping alkanolamine | | | | | |
| kind | a1 | a1 | a1 | a2 | a2 |
| wt. % | 30 | 15 | 30 | 35 | 35 |
| Additive amine | | | | | |
| kind | b1 | b1 | b1 | b1 | b1 |
| wt. % | 50 | 65 | 30 | 25 | 25 |
| Organic solvent | | | | | |
| kind | — | — | s4 | s3 | s3 |
| wt. % | — | — | 15 | 15 | 15 |
| Anti-corrosion agent | | | | | |
| kind | c1 | c1 | c1 | c1 | c2 |
| wt. % | 5 | 5 | 5 | 5 | 3 |
| $H_2O$ wt. % | 15 | 15 | 20 | 20 | 22 |
| Stripping Conditions | | | | | |
| temp. (° C.) | 55 | 55 | 55 | 55 | 55 |
| time (min.) | 3 | 3 | 3 | 3 | 3 |

TABLE 3-2-continued

|  | Examples | | | | |
|---|---|---|---|---|---|
|  | 23 | 24 | 25 | 26 | 27 |
| Removal |  |  |  |  |  |
| resist residue 5 | A | A | A | A | A |
| Corrosion |  |  |  |  |  |
| Al-Cu circuit 3 | A | A | A | A | A | a[1] N-hydroxymethylethanolamine.
a[2] N-hydroxymethyl-N-methylethanolamine.
b[1] Ethanolamine.
s[3] Dimethylacetamide.
s[4] Diethylene glycol monobutyl ether.
c[1] Sorbitol.
c[2] Catechol.

TABLE 3-3

|  | Examples | | | |
|---|---|---|---|---|
|  | 28 | 29 | 30 | 31 |
| Stripping Agent |  |  |  |  |
| Stripping alkanolamine |  |  |  |  |
| kind | a3 | a1 | a4 | a5 |
| wt. % | 15 | 35 | 5 | 15 |
| Additive amine |  |  |  |  |
| kind | b1 | b2 | b1 | b1 |
| wt. % | 65 | 25 | 70 | 65 |
| Organic solvent |  |  |  |  |
| kind | — | s3 | — | — |
| wt. % | — | 15 | — | — |
| Anti-corrosion agent |  |  |  |  |
| kind | c1 | c1 | c1 | c2 |
| wt. % | 5 | 5 | 3 | 5 |
| H$_2$O |  |  |  |  |
| wt. % | 15 | 20 | 22 | 15 |
| Stripping Conditions |  |  |  |  |
| temp. (° C.) | 55 | 55 | 55 | 55 |
| time (min.) | 3 | 3 | 3 | 3 |
| Removal |  |  |  |  |
| resist residue 5 | A | A | A | A |
| Corrosion |  |  |  |  |
| Al-Cu circuit 3 | A | A | A | A | a[1] N-hydroxymethylethanolamine.
a[3] N-hydroxymethylamine.
a[4] N,N-dihydroxymethylethanolamine.
a[5] N-hydroxymethylmorpholine.
b[1] Ethanolamine.
c[1] Sorbitol.
c[2] Catechol.

TABLE 4

|  | Comparative Examples | | | | | | | |
|---|---|---|---|---|---|---|---|---|
|  | 10 | 11 | 12 | 13 | 14 | 15 | 16 | 17 |
| Stripping Agent |  |  |  |  |  |  |  |  |
| Stripping alkanolamine |  |  |  |  |  |  |  |  |
| kind | — | — | — | — | — | — | — | — |
| wt. % | — | — | — | — | — | — | — | — |

TABLE 4-continued

|  | Comparative Examples | | | | | | | |
|---|---|---|---|---|---|---|---|---|
|  | 10 | 11 | 12 | 13 | 14 | 15 | 16 | 17 |
| Additive amine |  |  |  |  |  |  |  |  |
| kind | b1 | b1 | b1 | b1 | b1 | b1 | b2 | b1 |
| wt. % | 100 | 70 | 80 | 70 | 60 | 60 | 60 | 75 |
| Organic solvent |  |  |  |  |  |  |  |  |
| kind | — | s1 | s1 | s3 | s4 | s3 | s3 | — |
| wt. % | — | 30 | 20 | 30 | 15 | 15 | 15 | — |
| Anti-corrosion agent |  |  |  |  |  |  |  |  |
| kind | — | — | — | — | c1 | c2 | c1 | c1 |
| wt. % | — | — | — | — | 5 | 3 | 5 | 3 |
| H$_2$O | — | — | — | — | 20 | 22 | 20 | 22 |
| wt. % |  |  |  |  |  |  |  |  |
| Stripping Conditions |  |  |  |  |  |  |  |  |
| temp. (° C.) | 100 | 80 | 55 | 55 | 55 | 55 | 55 | 55 |
| time (min.) | 10 | 8 | 5 | 5 | 3 | 3 | 3 | 3 |
| Removal |  |  |  |  |  |  |  |  |
| resist residue 5 | D | D | D | D | C | C | D | D |
| Corrosion |  |  |  |  |  |  |  |  |
| Al—Cu circuit 3 | A | A | A | A | A | A | A | A | b1 Ethanolamine.
b2 N-methylethanolamine.
s1 Dimethyl sulfoxide.
s3 Dimethylacetamide.
s4 Diethylene glycol monobutyl ether.
c1 Sorbitol.
c2 Catechol.

EXAMPLES 32–44 AND COMPARATIVE EXAMPLES 18–25

Figure 3:
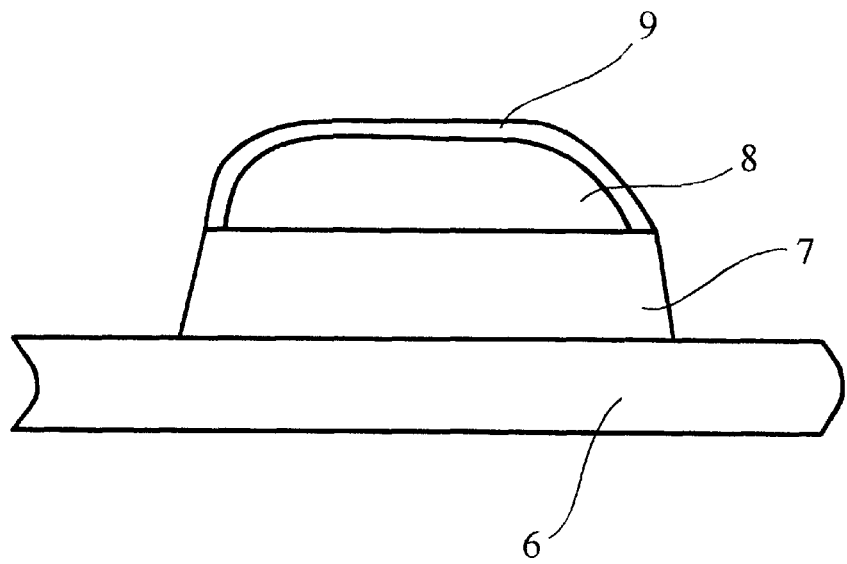
FIG. 3 is a cross sectional view showing a liquid crystal display device having chromium (Cr) circuit pattern formed by wet etching with a solution of ammonium cerium (IV) nitrate and perchloric acid using a resist film as a mask.

FIG. 3 is a cross sectional view of a liquid crystal display device, in which chromium (Cr) circuit pattern 7 is formed on a glass substrate 6 by wet-etching underlying chromium film with a solution of ammonium cerium (IV) nitrate and perchloric acid using a resist film 8 as a mask. During the wet etching, the surface layer of the resist film 8 became a hardened resist film 9.

Liquid crystal display devices after the wet etching as shown in FIG. 3 were immersed in resist stripping agents having chemical compositions shown in Tables 5 and 6 for predetermined period of time, rinsed with isopropanol, dried and observed under scanning electron microscope (SEM) to evaluate the removal of the resist film 8 and hardened resist film 9 based on the same ratings as above. The results are shown in Tables 5 and 6.

TABLE 5-1

|  | Examples | | | | |
|---|---|---|---|---|---|
|  | 32 | 33 | 34 | 35 | 36 |
| Stripping Agent |  |  |  |  |  |
| Stripping alkanolamine |  |  |  |  |  |
| kind | a1 | a6 | a7 | a8 | a9 |
| wt. % | 100 | 100 | 100 | 100 | 100 |
| Additive amine |  |  |  |  |  |
| kind | — | — | — | — | — |
| wt. % | — | — | — | — | — |

TABLE 5-1-continued

|  | Examples | | | | |
| --- | --- | --- | --- | --- | --- |
|  | 32 | 33 | 34 | 35 | 36 |
| Organic solvent | | | | | |
| kind | — | — | — | — | — |
| wt. % | — | — | — | — | — |
| Anti-corrosion agent | | | | | |
| kind | — | — | — | — | — |
| wt. % | — | — | — | — | — |
| $H_2O$ | | | | | |
| wt. % | — | — | — | — | — |
| Stripping Conditions | | | | | |
| temp. (° C.) | 40 | 40 | 40 | 40 | 40 |
| time (min.) | 10 | 8 | 15 | 10 | 15 |
| Removal | | | | | |
| resist film 8 | A | A | A | A | A |
| hardened film 9 | A | A | A | A | A | a1 N-hydroxymethylethanolamine.
a6 N-hydroxymethylethylenediamine.
a7 N-(α-hydroxymethyl)ethanolamine.
a8 N-hydroxymethylbutylamine.
a9 N-hydroxymethylisopropanolamine.

TABLE 5-2

|  | Examples | | | | | |
| --- | --- | --- | --- | --- | --- | --- |
|  | 37 | 38 | 39 | 40 | 41 | 42 |
| Stripping Agent | | | | | | |
| Stripping alkanolamine | | | | | | |
| kind | a1 | a1 | a1 | a1 | a6 | a1 |
| wt. % | 40 | 40 | 40 | 20 | 20 | 20 |
| Additive amine | | | | | | |
| kind | b1 | b1 | b2 | b1 | b3 | b1 |
| wt. % | 40 | 40 | 40 | 35 | 45 | 35 |
| Organic solvent | | | | | | |
| kind | s1 | s3 | s3 | s4 | s3 | s3 |
| wt. % | 20 | 20 | 20 | 15 | 15 | 15 |
| Anti-corrosion agent | | | | | | |
| kind | — | — | — | — | — | c1 |
| wt. % | — | — | — | — | — | 5 |
| $H_2O$ | | | | | | |
| wt. % | — | — | — | 30 | 20 | 25 |
| Stripping Conditions | | | | | | |
| temp. (° C.) | 40 | 40 | 40 | 40 | 40 | 40 |
| time (min.) | 5 | 5 | 5 | 3 | 1 | 3 |
| Removal | | | | | | |
| resist film 8 | A | A | A | A | A | A |
| hardened film 9 | A | A | A | A | A | A | a1 N-hydroxymethylethanolamine.
a6 N-hydroxymethylethylenediamine.
b1 Ethanolamine.
b2 N-methylethanolamine.
b3 Ethylenediamine.
s1 Dimethyl sulfoxide.
s3 Dimethylacetamide.
s4 Diethylene glycol monobutyl ether.
c1 Sorbitol.

TABLE 5-3

|  | Examples | |
| --- | --- | --- |
|  | 43 | 44 |
| Stripping Agent | | |
| Stripping alkanolamine | | |
| kind | a1 | a1 |
| wt. % | 20 | 20 |
| Additive amine | | |
| kind | b4 | b5 |
| wt. % | 15 | 35 |
| Organic solvent | | |
| kind | s3 | s4 |
| wt. % | 45 | 15 |
| Anti-corrosion agent | | |
| kind | c2 | c1 |
| wt. % | 5 | 2 |
| $H_2O$ | | |
| wt. % | 15 | 28 |
| Stripping Conditions | | |
| temp. (° C.) | 40 | 40 |
| time (min.) | 3 | 3 |
| Removal | | |
| resist film 8 | A | A |
| hardened film 9 | A | A | a1 N-hydroxymethylethanolamine.
b4 Hydroxylamine.
b5 2-(2-Aminoethoxy)ethanol.
s3 Dimethylacetamide.
s4 Diethylene glycol monobutyl ether.
c1 Sorbitol.
c2 Catechol.

TABLE 6

|  | Comparative Examples | | | | | | | |
| --- | --- | --- | --- | --- | --- | --- | --- | --- |
|  | 18 | 19 | 20 | 21 | 22 | 23 | 24 | 25 |
| Stripping Agent | | | | | | | | |
| Stripping alkanolamine | | | | | | | | |
| kind | — | — | — | — | — | — | — | — |
| wt. % | — | — | — | — | — | — | — | — |
| Additive amine | | | | | | | | |
| kind | b1 | b3 | b6 | b7 | b1 | b3 | b5 | b1 |
| wt. % | 100 | 100 | 100 | 100 | 70 | 60 | 55 | 55 |
| Organic solvent | | | | | | | | |
| kind | — | — | — | — | s1 | s3 | s4 | s4 |
| wt. % | — | — | — | — | 30 | 20 | 15 | 15 |
| Anti-corrosion agent | | | | | | | | |
| kind | — | — | — | — | — | — | c1 | — |
| wt. % | — | — | — | — | — | — | 2 | — |
| $H_2O$ | | | | | | | | |
| wt. % | — | — | — | — | — | 20 | 28 | 30 |
| Stripping Conditions | | | | | | | | |
| temp. (° C.) | 40 | 40 | 40 | 40 | 40 | 40 | 40 | 40 |
| time (min.) | 10 | 8 | 10 | 15 | 5 | 3 | 3 | 3 |

TABLE 6-continued

| | Comparative Examples | | | | | | | |
|---|---|---|---|---|---|---|---|---|
| | 18 | 19 | 20 | 21 | 22 | 23 | 24 | 25 |
| Removal | | | | | | | | |
| resist film 8 | C | C | D | C | D | C | C | C |
| hardened film 9 | D | C | D | D | D | D | D | D | b1 Ethanolamine.
b3 Ethylenediamine.
b5 2-(2-Aminoethoxy)ethanol.
b6 Butylamine.
b7 Isopropanolamine.
s1 Dimethyl sulfoxide.
s3 Dimethylacetamide.
s4 Diethylene glycol monobutyl ether.
c1 Sorbitol.

EXAMPLE 45

The semiconductor devices used in Examples 17–31 were immersed in a stripping agent at 50° C. for 3 minutes, rinsed with isopropanol, dried and observed under SEM. The stripping agent comprised 25% by weight of N-hydroxymethylethanolamine, 35% by weight of ethanolamine, 15% by weight diethylene glycol monobutyl ether, 7% by weight of sorbitol, 0.5% by weight of TMAH and 17.5% by weight of water. As a result of SEM observation, it was confirmed that the resist residue 5 of any of the semiconductor devices was completely removed with no corrosion on the aluminum (Al—Cu) circuit pattern.

As described above, the resist stripping agent of the present invention has excellent removal capability, and easily removes resist films and resist residues at lower temperatures for a short period of time. In addition, during the removal of resist, the resist stripping agent causes no corrosion against inorganic substrates made of various materials. With these properties, the resist stripping agent is useful for use in semiconductor device production.

What is claimed is:

1. A resist stripping agent comprising:

a stripping alkanolamine represented by the following formula (II):

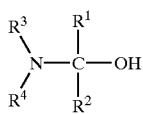

(II)

wherein $R^1$ and $R^2$ are each hydrogen atom, $C_1$–$C_8$ alkyl or $C_1$–$C_8$ alkenyl, $R^3$ is $C_1$–$C_{10}$ alkyl, $C_1$–$C_{10}$ alkenyl, amino, hydroxyethyl, hydroxy-i-propyl, $C_1$–$C_{10}$ aminoalkyl, ($C_1$–$C_{10}$ alkyl)phenyl, phenyl($C_1$–$C_{10}$)alkyl, $C_1$–$C_{10}$ alkoxy, ($C_1$–$C_{10}$)alkoxy($C_1$–$C_{10}$)alkyl, hydroxy($C_1$–$C_{10}$)alkyloxy($C_1$–$C_{10}$)alkyl, $C_1$–$C_{10}$ alkylamino, amino($C_1$–$C_{10}$)alkyloxy($C_1$–$C_{10}$)alkyl, hydroxy($C_1$–$C_{10}$)alkylamino($C_1$–$C_{10}$)alkyl; $R^4$ is hydrogen, —CH$_2$OH, —CH(OH)CH$_3$, $C_1$–$C_{10}$alkyl, $C_1$–$C_{10}$ alkenyl, amino, $C_1$–$C_{10}$ hydroxyalkyl, $C_1$–$C_{10}$aminoalkyl, ($C_1$–$C_{10}$ alkyl)phenyl, phenyl($C_1$–$C_{10}$)alkyl, $C_1$–$C_{10}$ alkoxy, ($C_1$–$C_{10}$)alkoxy($C_1$–$C_{10}$)alkyl, hydroxy($C_1$–$C_{10}$)alkyloxy($C_1$–$C_{10}$)alkyl, $C_1$–$C_{10}$ alkylamino, amino($C_1$–$C_{10}$)alkyloxy($C_1$–$C_{10}$)alkyl, hydroxy($C_1$–$C_{10}$)alkylamino($C_1$–$C_{10}$)alkyl; or $R^3$ and $R^4$ together with the nitrogen to which $R^3$ and $R^4$ are bonded may form cyclic amino having 1 to 12 carbon atoms;

an additive amine selected from the group consisting of methylamine, ethylamine, propylamine, butylamine, ethanolamine, N-methylethanolamine, N-ethylethanolamine, diethanolamine, isopropanolamine, 2-(2-aminoethoxy)ethanol, ethylenediamine, propylenediamine, butylenediamine, diethylenetriamine, hydroxylamine, N,N-diethylhydroxylamine, piperazine and morpholine, the molar ratio of the stripping alkanolamine and the additive amine being 0.01 to 100; and a water-soluble organic solvent selected from the group consisting of dimethyl sulfoxide, N,N-dimethylformamide, N,N-dimethylacetamide, N-methylpyrrolidone, diethylene glycol monomethyl ether, diethylene glycol monobutyl ether, dipropylene glycol monomethyl ether and dipropylene glycol monobutyl ether in an amount of 5 to 80% by weight based on the resist stripping agent.

2. The resist stripping agent according to claim 1, wherein $R^1$ and $R^2$ are each hydrogen.

3. The resist stripping agent according to claim 1, wherein $R^1$ is hydrogen and $R^2$ is methyl.

4. The resist stripping agent according to claim 1, wherein said stripping alkanolamine is a compound selected from the group consisting of N-hydroxymethylethanolamine, N-hydroxymethylisopropanolamine, N,N-dihydroxymethylethanolamine, N-hydroxymethyidiethanolamine, N-hydroxymethyl-N-methylethanolamine, N-hydroxymethyl-N-ethylethanolamine, N-hydroxymethylaminoethoxyethanol, N,N'-dihydroxymethylethylenediamine, N-hydroxymethylethylenediamine, N,N-dihydroxymethylethylenediainine, N,N,N'-trihydroxymethylethylenediamine, N,N,N',N'-tetrahydroxymethylethylenediamine, N-hydroxymethylbutylenediamine, N-hydroxymethylpropylenediamine, N,N'-dihydroxymethylbutylenediamine, N,N-dihydroxymethylbutylenediamine, N,N,N'-trihydroxymethylbutylenediamine, N,N,N',N'-tetrahydroxymethylbutylenediamine, N,N'-dihydroxymethylpropylenediamine, N,N-dihydroxymethylpropylenediamine, N,N,N'-trihydroxymethylpropylenediamine, N,N,N',N'-tetrahydroxymethylpropylenediamine, N-hydroxymethyldiethylenetriamine, N,N"-dihydroxymethyldiethylenetriamine, N-hydroxymethylmethylamine, N,N-dihydroxymethylmethylamine, N-hydroxymethyldimethylamine, N-hydroxymethylethylamine, N-hydroxymethyldiethylamine, N,N-dihydroxymethylethylamine, N-hydroxymethylpropylamine, N-hydroxymethylbutylamine, N-hydroxymethylpiperazine, and N-hydroxymethylmorpholine.

5. The resist stripping agent according to claim 1, further comprising water in an amount of 5 to 60% by weight based on the resist stripping agent.

6. The resist stripping agent according to claim 1, further comprising an anti-corrosion agent in an amount of 1 to 35% by weight based on the resist stripping agent.

7. The resist stripping agent according to claim 6, wherein said anti-corrosion agent is at least one compound selected from the group consisting of sugars, sugar alcohols, aromatic hydroxy compounds, acetylene alcohols, organic carboxy compounds and anhydrides thereof, and triazole compounds.

8. The resist stripping agent according to claim 6, wherein said anti-corrosion agent is sorbitol or catechol.

9. The resist stripping agent according to claim 1, further comprising an amount of tetramethylammonium hydroxide.

10. The resist stripping agent according to claim 1, consisting essentially of said stripping amine, said additive amine and said water-soluble organic solvent.

* * * * *